(12) United States Patent
Chen et al.

(10) Patent No.: US 12,289,849 B2
(45) Date of Patent: Apr. 29, 2025

(54) METAL-PLASTIC COMPOSITE PART AND METHOD OF MAKING SAME, AND ELECTRONIC DEVICE HOUSING HAVING SAME

(71) Applicant: Fulian Yuzhan Precision Technology Co., Ltd., Shenzhen (CN)

(72) Inventors: Ke-Na Chen, Shenzhen (CN); Pei-Bang Yang, Shenzhen (CN)

(73) Assignee: Fulian Yuzhan Precision Technology Co., Ltd., Shenzhen (CN)

(*) Notice: Subject to any disclaimer, the term of this patent is extended or adjusted under 35 U.S.C. 154(b) by 477 days.

(21) Appl. No.: 17/941,183

(22) Filed: Sep. 9, 2022

(65) Prior Publication Data

US 2023/0217621 A1 Jul. 6, 2023

(30) Foreign Application Priority Data

Dec. 31, 2021 (CN) .......................... 202111668065.X

(51) Int. Cl.
| | |
|---|---|
| *H05K 5/04* | (2006.01) |
| *B29C 45/00* | (2006.01) |
| *B29C 45/14* | (2006.01) |
| *B29K 67/00* | (2006.01) |
| *B29K 105/12* | (2006.01) |

(Continued)

(52) U.S. Cl.
CPC .......... *H05K 5/04* (2013.01); *B29C 45/0005* (2013.01); *B29C 45/0046* (2013.01); *B29C 45/14221* (2013.01); *B29C 2045/0058* (2013.01); *B29C 2045/0077* (2013.01);
(Continued)

(58) Field of Classification Search
CPC .... B29C 2045/0058; B29C 2045/0077; B29C 45/0005; B29C 45/0046; B29C 45/14221; B29C 45/14311; B29C 45/14336; B29K 2067/006; B29K 2105/12; B29K 2309/08; B29L 2031/3481; H05K 5/04
See application file for complete search history.

(56) References Cited

U.S. PATENT DOCUMENTS

| | | | | |
|---|---|---|---|---|
| 2012/0108136 A1* | 5/2012 | Elia | ........................ | C08J 5/043 428/221 |
| 2012/0289112 A1* | 11/2012 | Mao | ...................... | B82Y 30/00 442/72 |

(Continued)

*Primary Examiner* — Timothy J Thompson
*Assistant Examiner* — Rhadames Alonzo Miller
(74) *Attorney, Agent, or Firm* — ScienBiziP, P.C.

(57) ABSTRACT

A method for making a composite piece comprised of a metal part and a glass-fiber-reinforced plastic part, comprising: providing a metal part with a receiving cavity and a flow guiding channel, the flow guiding channel having an inlet communicating with the receiving cavity and an outlet; introducing molten plastic reinforced with glass fibers into the receiving cavity to fill the receiving cavity and the flow guiding channel and overflows from the outlet to form a flash section; curing the molten plastic to obtain a plastic part; removing unwanted portion of the metal part together with a portion of the plastic part to obtain the composite piece, wherein the glass-fiber-reinforced plastic part includes an exposed surface and glass fibers exposed at the exposed surface are substantially parallel to each other. A metal-plastic composite part prepared by the method and an electronic device housing are also disclosed.

20 Claims, 18 Drawing Sheets

(51) Int. Cl.
*B29K 309/08* (2006.01)
*B29L 31/34* (2006.01)

(52) U.S. Cl.
CPC .... *B29K 2067/006* (2013.01); *B29K 2105/12* (2013.01); *B29K 2309/08* (2013.01); *B29L 2031/3481* (2013.01)

(56) References Cited

U.S. PATENT DOCUMENTS

| | | | |
|---|---|---|---|
| 2016/0101592 A1* | 4/2016 | Sauer | B32B 5/024 428/212 |
| 2018/0281983 A1* | 10/2018 | Kamihara | B32B 5/12 |
| 2020/0009639 A1* | 1/2020 | Watanabe | B29C 53/36 |
| 2020/0316915 A1* | 10/2020 | Ibaragi | B29C 65/485 |
| 2021/0107269 A1* | 4/2021 | Takahashi | B32B 38/1866 |
| 2021/0187908 A1* | 6/2021 | Ibaragi | B32B 7/12 |
| 2021/0244118 A1* | 8/2021 | Fujioka | B32B 5/26 |
| 2022/0097345 A1* | 3/2022 | Yoshioka | B32B 5/26 |

\* cited by examiner

METAL-PLASTIC COMPOSITE PART AND METHOD OF MAKING SAME, AND ELECTRONIC DEVICE HOUSING HAVING SAME

CROSS-REFERENCE TO RELATED APPLICATION

This application claims priority to China Application No. 202111668065.X, having a filing date of Dec. 31, 2021, filed in China State Intellectual Property Administration, the entire contents of which are hereby incorporate by reference.

FIELD

The subject matter relates to material processing technologies, and more particularly, to a method of making a composite piece comprised of metal part and glass-fiber-reinforced plastic part, a metal-plastic composite part, and an electronic device housing.

BACKGROUND

As requirements for enhanced properties for plastic materials are gradually increasing, glass fiber is generally added to plastic materials as a reinforcing material to improve performance of plastic materials, such as rigidity and strength. Metal-plastic composites made from glass-fiber-reinforced plastic are usually prepared by plastic injection molding on a metal base, which provides plastic for connecting two pieces of metals, structural parts can thus be obtained. However, glass-fiber-reinforced plastic of such structural parts tends to have various appearance defects, such as glass fiber rich surfaces, vortices during injection molding process, and so on, which result in unsatisfactory-looking structural parts.

SUMMARY

An objective of the present disclosure is achieved by providing a method of making composite piece comprised of metal part and glass-fiber-reinforced plastic part, a metal-plastic composite part, and an electronic device housing.

In order to achieve the purpose of eliminating defects in appearance, technical solutions adopted by the present disclosure are as follows:

An aspect of the present disclosure provides a method for making a composite piece comprised of a metal part and a glass-fiber-reinforced plastic part, the method comprising:

providing a metal part comprising a main body and an unwanted portion adjoining the main body;

defining a receiving cavity in the metal part, wherein the receiving cavity extending through the main body and extending halfway in the unwanted portion;

defining a flow guiding channel through the unwanted portion, the flow guiding channel having an inlet communicating with the receiving cavity and an outlet, a size of the flow guiding channel being gradually decreased along a direction from the inlet to the outlet;

introducing molten plastic reinforced with glass fibers into the receiving cavity from a surface of the main body facing away from the unwanted portion to fill the receiving cavity and the flow guiding channel, the molten plastic reinforced with glass fibers thereby overflowing from the outlet to form a flash section, wherein the glass fibers in the molten plastic which flow through the flow guiding channel are thereby oriented substantially parallel to each other;

curing the molten plastic to obtain a plastic part comprising a cured plastic portion in the receiving cavity and the flow guiding channel, and a flash part cured from the flash section;

removing the unwanted portion together with a portion of the cured plastic portion received in the flow guiding channel and a portion of the cured plastic portion received in part of the receiving cavity which is located within the unwanted portion, to obtain the composite piece comprising a glass-fiber-reinforced plastic part, wherein the glass-fiber-reinforced plastic part includes an exposed surface and glass fibers exposed at the exposed surface are substantially parallel to each other.

According to further embodiments, a projection of the outlet on a plane where the exposed surface is located, is located within a projection of the inlet on said plane.

According to further embodiments, in a first direction perpendicular to said plane, the main body has a thickness $L$, the unwanted portion has a thickness $L_1$, the flash part extruding from the metal piece has a height $L_2$, wherein $L_1 \geq L$, $L_2 \geq L$.

According to further embodiments, in a second direction perpendicular to the first direction, the receiving cavity has a width of $W$, and the flash part has a width of $W_1$, wherein $W_1 \geq W$.

According to further embodiments, in the second direction, the outlet has a width $W_4$, and the inlet has a width $W_2$, wherein $W_2 > W_4 \geq \frac{1}{2} W_2$.

According to further embodiments, the metal part is comprised of a first metal portion and a second metal portion, the first metal portion comprises a first side adjacent to the second metal portion, a second side, and a third side opposite to the second side, the second side and the third side are both connected to the first side, the receiving cavity is defined by cutting the first metal portion from the first side and the second side, the flow guiding channel is defined by cutting the first metal portion from the first side and the third side.

According to further embodiments, the flow guiding channel comprises a channel wall facing the second metal portion, the channel wall is comprised of a first wall, a second wall, and a third wall connected in turn, wherein the first wall and the third wall are parallel to a central axis of the flow guiding channel, a distance between the second metal portion and the first wall is smaller than that between the second metal portion and the third wall, the second wall is inclined arranged relative to the central axis, a sum of lengths of the first wall and the second wall in the first direction is $L_3$, $L_3 \geq L$, the first wall has a length $L_4$ in direction of the central axis, wherein $L_4 \leq \frac{1}{2} L_3$.

According to further embodiments, a first angle b is formed between the second wall and the central axis, the maximum tangent value and minimum tangent value of the first angle b satisfy following formula $\tan b_{max} = (W_2 - \frac{1}{2} W_2)/(L_3 - \frac{1}{2} L_3) = W_2/L_3$ and $\tan b_{min} = (W_2 - \frac{3}{4} W_2)/L_3 = W_2/4L_3$.

According to further embodiments, the flow guiding channel further comprises two fourth walls arranged relative to each other, the two fourth walls are connected to the channel wall and inclined towards the central axis as extended to the outlet of the flow guiding channel, a second angle a is formed between the fourth wall and the third side, the second angle a is in a range from 30° to 60°.

According to further embodiments, the method further comprises machining a top surface of the metal-plastic composite part, thereby obtaining the machined top surface comprised of two arc portions and a flat portion arranged between the two arc portions, wherein in longitudinal direction of the receiving cavity, the flat portion has a length H and the flash part has a length h, wherein h≥H.

According to an aspect of the present disclosure, a metal-plastic composite part is provided, comprising a metal portion including a first surface and an opposite second surface, wherein the metal portion includes a receiving channel extending through the first surface and the second surface; a plastic portion containing reinforced glass fibers attached to the first surface of the metal portion; wherein the plastic portion comprises a filling portion extending into and filling the receiving channel, the filling portion has an exposed surface flush with the second surface, glass fibers having cross sectional faces exposed at the exposed surface of the filling portion cooperatively forming a pattern consisting essentially of dots.

According to an aspect of the present disclosure, an electronic device housing is provided, comprising:
- a metal portion including a first surface and a second surface opposite to the first surface, wherein the metal portion includes a receiving channel extending through the first surface and the second surface;
- a plastic portion containing reinforced glass fibers attached to the metal portion at the first surface;
- wherein the plastic portion comprises a filling portion extending into and filling the receiving channel, the filling portion has an exposed surface flush with the second surface, glass fibers exposed at the exposed surface are parallel to each other.

According to further embodiments, the glass fibers have cross-sections exposed at the exposed surface, the cross-sections thereof forming a pattern consisting essentially of dots on the exposed surface.

According to further embodiments, a metal-plastic composite part is comprised of the filling portion and the metal portion, the metal-plastic composite part comprises two arc portions and a flat portion arranged between the two arc portions.

According to further embodiments, the metal portion includes two spaced metal parts separated by the receiving channel.

According to further embodiments, each of the glass fibers has a diameter in a range from 9 μm to 13 μm.

According to further embodiments, a content of the glass fibers in the plastic portion is in a range from 3 wt. % to 20 wt. %.

According to further embodiments, the plastic portion comprises polybutylene terephthalate.

According to further embodiments, the pattern consists essentially of the dots and strips, an area proportion of the dots in the exposed surface is greater than or equal to 90%.

According to further embodiments, a radius of each of the dots on the exposed surface is equal to that of corresponding one of the glass fibers; a length of each of the strips on the exposed surface is larger than the radius of corresponding one of the glass fibers.

BRIEF DESCRIPTION OF THE DRAWINGS

Implementations of the present technology will now be described, by way of example only, with reference to the attached figures.

FIG. 0.15 is a cross-sectional view taken along line D-D of FIG. 4;

DETAILED DESCRIPTION

Figure 1:
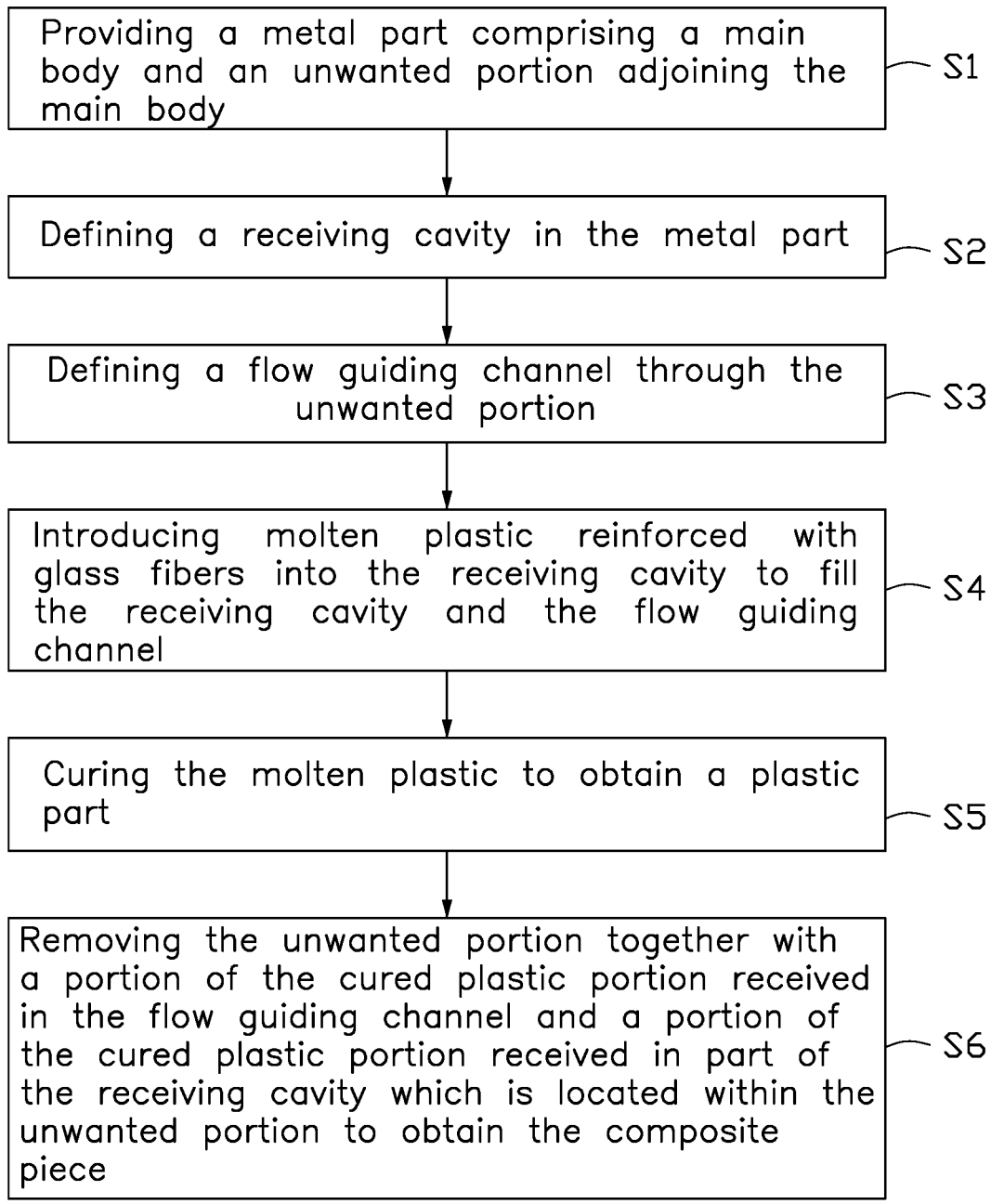
FIG. 1 is a flow diagram of a method for making a workpiece of metal-plastic composite according to an embodiment of the present disclosure.

It will be appreciated that for simplicity and clarity of illustration, where appropriate, reference numerals have been repeated among the different figures to indicate corresponding or analogous components. The description is not to be considered as limiting the scope of the embodiments described herein. The drawings are not necessarily to scale and the proportions of certain parts may be exaggerated to better illustrate details and features of the present disclosure.

It should be understood that, the terms "first" and "second" are used to distinguish elements and are not used to denote a particular order or imply a number of technical features, therefore, unless being specifically defined, features described as "first" and "second" may expressly or implicitly include one or more of the stated features. In the description of the present application, "plurality" means two or more, unless otherwise expressly and specifically defined.

In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described.

The term "comprising," when utilized, means "including, but not necessarily limited to"; it specifically indicates open-ended inclusion or membership in the so-described combination, group, series, and the like.

A method of preparing a metal-plastic composite made from glass-fiber-reinforced plastic comprises: providing a metal piece comprising a main body and a unwanted portion; providing a receiving cavity on the metal piece, wherein the receiving cavity traverses the metal piece with a depth extending through the main body and part of the unwanted portion; providing a flow channel connecting to the bottom of the receiving cavity, wherein the flow channel extends through the unwanted portion and is configured with an inlet for connecting with the receiving cavity and an outlet on the unwanted portion, the outlet is larger than the inlet, which allows the flow channel to have a tapered shape; performing plastic molding on surface of the main body away from the unwanted portion, wherein molten plastic with glass fibers is fed into the receiving cavity to fill the receiving cavity and the flow channel, then overflows from the outlet to form a flash section, the glass fibers are guided by the tapered flow channel to be oriented parallel to the flow direction; curing the molten plastic to form a plastic part on the surface of the main body away from the unwanted portion, the plastic part comprises the molten plastic cured in the receiving cavity and the flow channel, the flash section is cured to form a flash part; removing the unwanted portion together with the cured plastic in the flow channel and part of the receiving cavity to obtain a metal-plastic composite part, wherein the plastic part in the receiving cavity is exposed after the removal and the glass fibers in the plastic part exposed are substantially parallel to each other.

Therefore, the tapered flow channel together with the overflow configuration provide a flow path for the molten plastic, which guides the glass fibers in the molten plastic to move along the flow path with an orientation substantially parallel to the flow channel and leads the vortex to be away from the main body; after removing the unwanted portion, the metal-plastic composite part is obtained and the glass fibers are distributed in predetermined orientation, further, the glass fibers are exposed as a distribution of dots, which improves the appearance of the metal-plastic composite part.

According to further embodiments, a metal-plastic composite part prepared by the preparation method mentioned above is provided.

According to further embodiments, an electronic device housing is provided, the electronic device housing comprises: a metal portion configured with a first surface and a second surface opposite to the first surface, wherein the metal portion is configured with a receiving channel extends through the first surface and the second surface; a plastic portion comprising glass fibers is attached to the metal portion at the first surface; wherein the plastic portion comprises a projection extending into and filling the receiving channel, the projection is configured with an exposed surface in the same plane with the second surface, the glass fibers exposed on the exposed surface are parallel to each other.

A detailed description of the hereinafter described embodiments of the disclosure is presented herein by way of exemplification and not as limitation with reference to the figures.

Glass fibers are generally added to plastic materials as a reinforcing material to improve performance of plastic materials, such as rigidity and strength. However, when such glass fiber-reinforced plastic is applied to housings of electronic devices with appearance as a priority, defects such as glass fiber rich surfaces or vortices during injection molding process is an issue.

Reasons for such defects in appearance are as follows:

A) Glass Fiber Rich Surface

Direct reasons: during injection molding process, molten plastic flows to fill a mold cavity, and then cools to be cured. However, for glass fiber-reinforced plastic, glass fibers and the molten plastic tends to separate from one another as they flow at different flow velocities due to their different densities, masses, and fluidities, then the glass fibers with lower density tend to float on a surface of the resultant plastic product to form the glass fiber rich surface.

Indirect reasons: flowing plastic in molten state is subjected to friction from screws, pouring runners, nozzles and gate, such frictions cause viscosity of the molten plastic to vary at different positions and damages to surfaces of the glass fibers, which reduces bonding power between the plastic and the glass fibers. When the bonding power is lower than a certain value, the glass fibers will be released from the plastic and float on the surface of the resultant plastic product.

B) Vortices

Direct reasons: polymer molecules of the plastic have a complex molecular orientation distribution due to fountain flow effect, the polymer molecules near leading edge of the plastic flow have a relatively regular arrangement of glass fibers almost parallel to the flow direction, and the polymer molecules near confluences of plastic flows have an irregular arrangement of glass fibers due to different properties and velocities of the confluent flows. When the velocity exceeds a certain value, the glass fibers will move in different directions thereby forming vortices of the glass fibers.

Indirect reasons: the molten plastic under a certain stress flowing in the cavity with a certain velocity can be regarded as similar to a constant flow in a pipe under pressure, such fluid will be separated to form a shear layer when encountering changes in size or shape in the boundary, the shear layer lacking stability further cause readjustment of the fluid thereby generating vortex, the glass fibers flow along the melt vortex.

Figure 2:
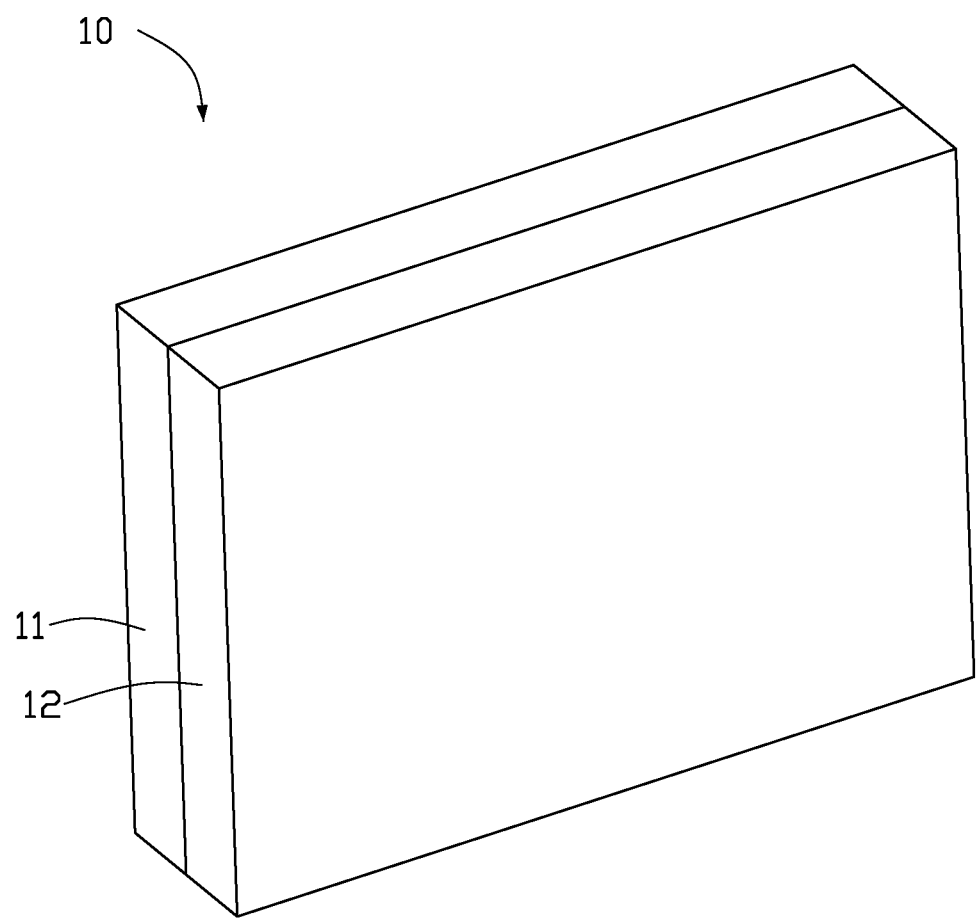
FIG. 2 is a perspective view of a metal piece according to an embodiment of the present disclosure.

To overcome above mentioned issues, referring to FIG. 1, a method for making a composite piece 50 comprised of a metal part and a glass-fiber-reinforced plastic part is provided according to an embodiment, the method comprises following steps:

S1: providing a metal part 10, as shown in FIG. 2, the metal part 10 comprises a main body 11 and an unwanted portion 12 adjoining the main body 11. The metal part 10 is flat and is made from aluminum alloys, it should be noted that, in further embodiments, the metal part 10 can be made from magnesium alloys, magnalium alloys, and any other suitable metal materials, and the metal part 10 can be shaped in any suitable form according to requirements.

The main body 11 and the unwanted portion 12 can be two separate pieces connected by gluing, bonding, welding, or other means. In further embodiments, the main body 11 and the unwanted portion 12 are formed as an integrated structure.

Figure 3:
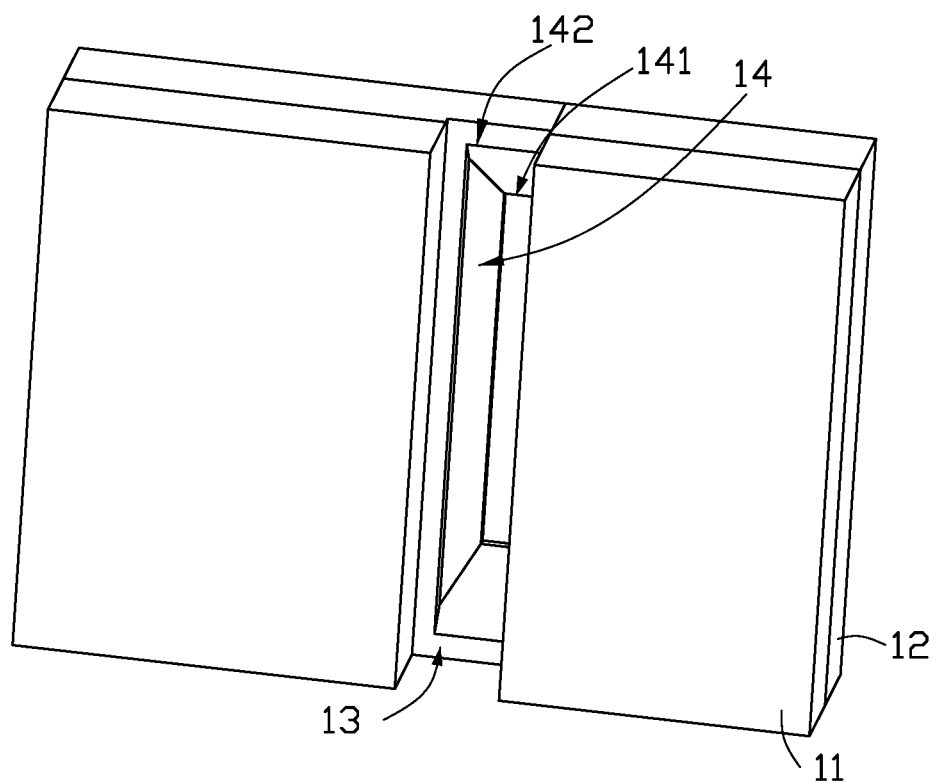
FIG. 3 is a perspective view of the metal piece obtained in step S3 process according to an embodiment of the present disclosure.

S2: referring to FIG. 3, a receiving cavity 13 is defined in the metal piece 10, wherein the receiving cavity 13 extends through the main body 11 and extending halfway in the unwanted portion 12.

S3: referring to FIG. 3, a flow guiding channel 14 is defined through the unwanted portion 12, wherein the flow guiding channel 14 has an inlet 142 communicating with the receiving cavity 13 and an outlet 141. A size of the flow guiding channel 14 is gradually decreased along a direction from the inlet 142 to the outlet 141.

Figure 4:
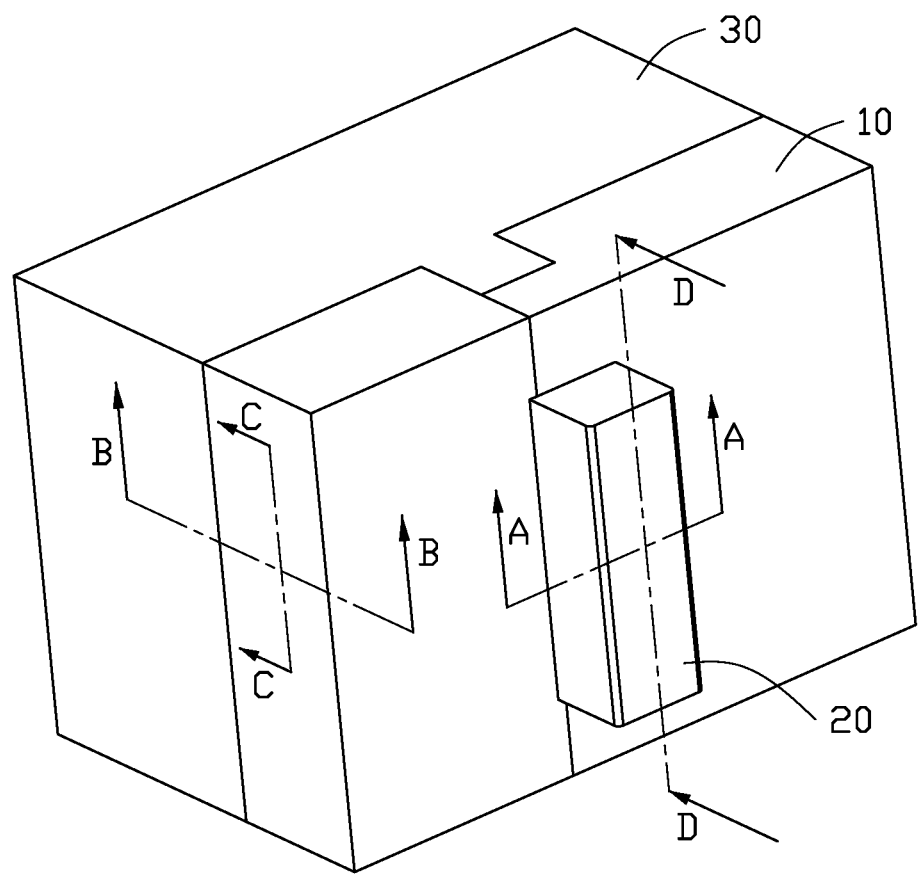
FIG. 4 is a perspective view of the metal piece obtained in step S4 process according to an embodiment of the present disclosure.
Figure 5:
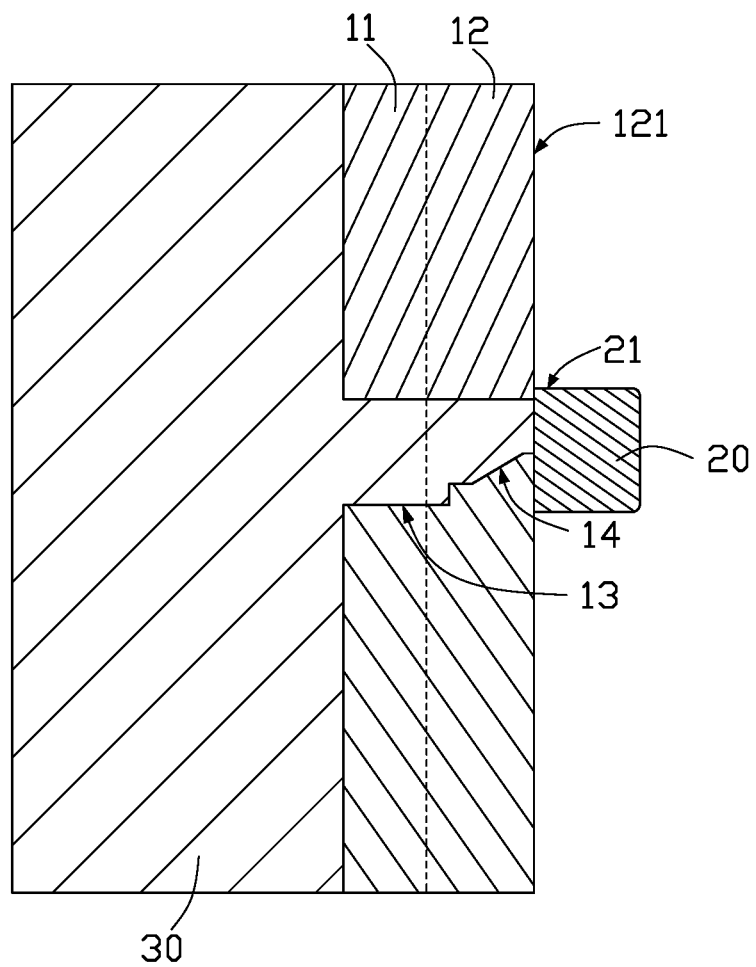
FIG. 5 is a cross-section view taken along line A-A in FIG. 4.

S4: referring to FIG. 4 and FIG. 5, molten plastic reinforced with glass fibers is introduced into the receiving cavity 13 from a surface of the main body 11 facing away from the unwanted portion 12 to fill the receiving cavity 13 and the flow guiding channel 14, the molten plastic reinforced with glass fibers thereby overflowing from the outlet 141 to form a flash section, wherein the glass fibers in the molten plastic which flow through the flow guiding channel 14 are thereby oriented substantially parallel to each other;

S5: the molten plastic is cured to obtain a plastic part 30 comprising a cured plastic portion 31 in the receiving cavity 13 and the flow guiding channel 14, and a flash part 20 cured from the flash section.

Figure 6:
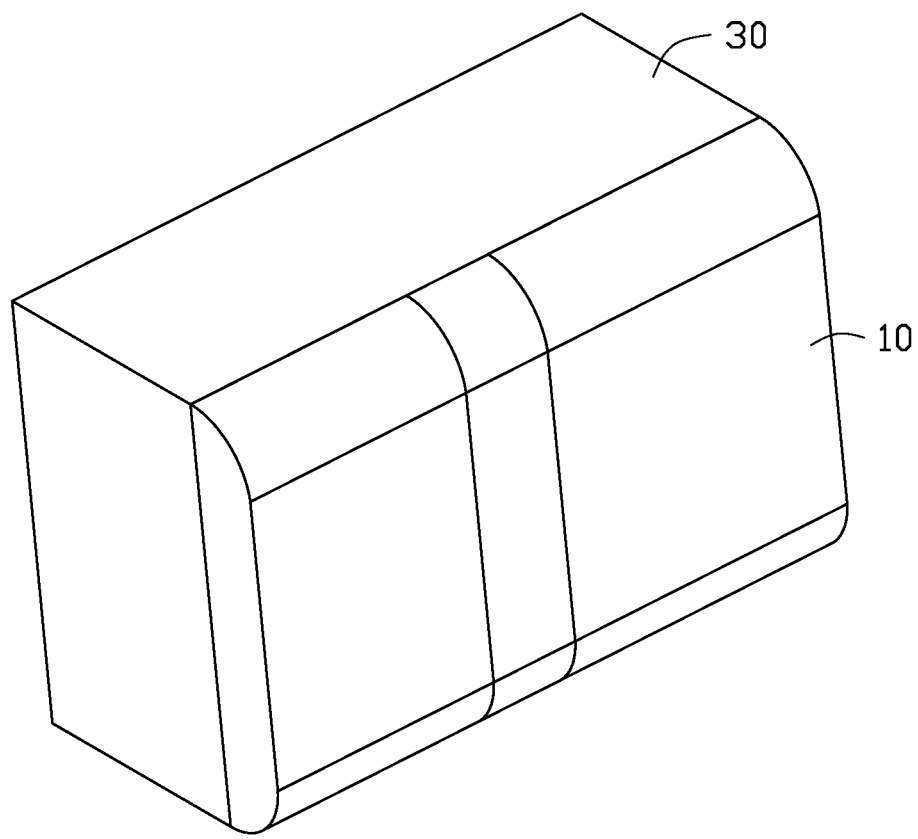
FIG. 6 is a perspective view of the metal piece obtained in step S6 process according to an embodiment of the present disclosure.

S6: as shown in FIG. 6, the unwanted portion 12 together with a portion of the cured plastic portion received in the flow guiding channel 14 and a portion of the cured plastic portion received in part of the receiving cavity 13 which is located within the unwanted portion 12 is removed to obtain the composite piece 50 comprising a glass-fiber-reinforced plastic part. The glass-fiber-reinforced plastic part includes an exposed surface and glass fibers exposed at the exposed surface are substantially parallel to each other.

Figure 7:
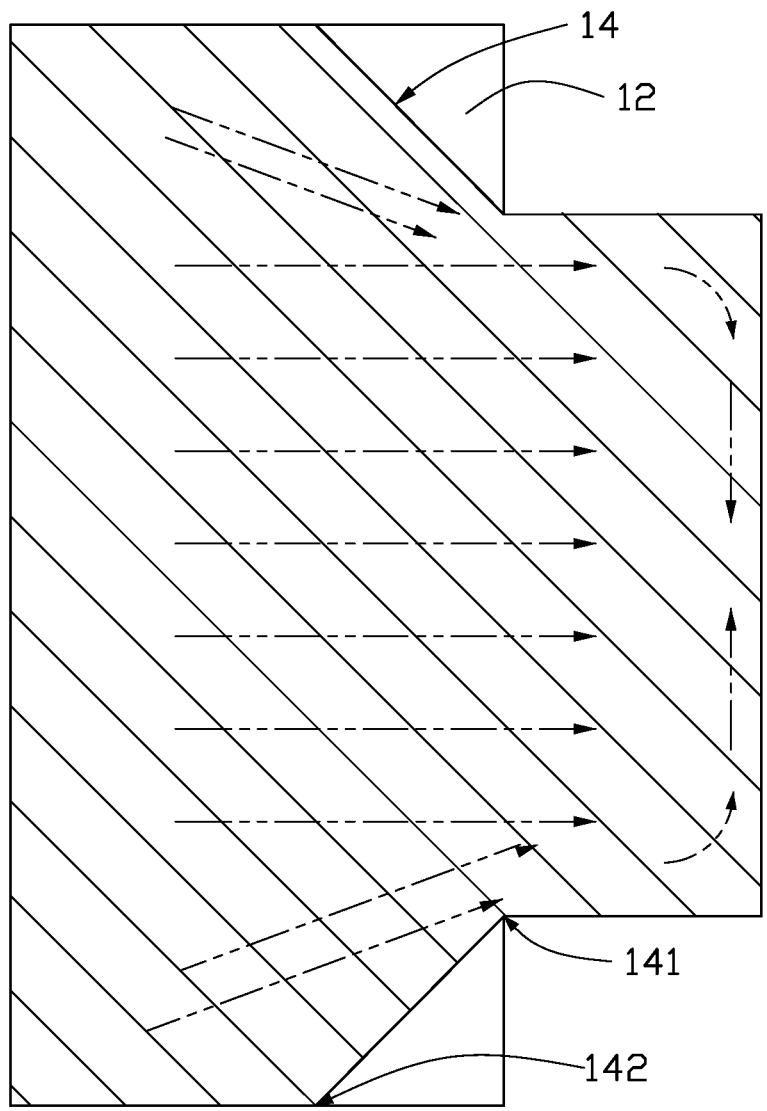
FIG. 7 is a cross-sectional view taken along line B-B of FIG. 4 showing a flow direction of the glass fibers.
Figure 8:
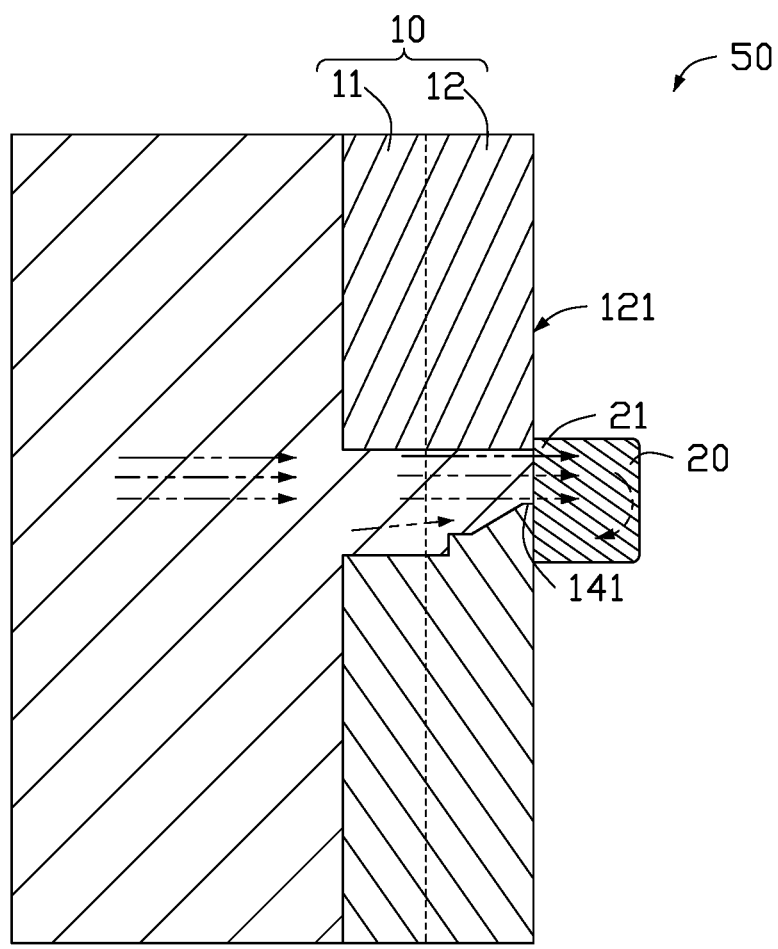
FIG. 8 is a cross-sectional view taken along line A-A of FIG. 4 showing a flow direction of glass fibers.
Figure 9:
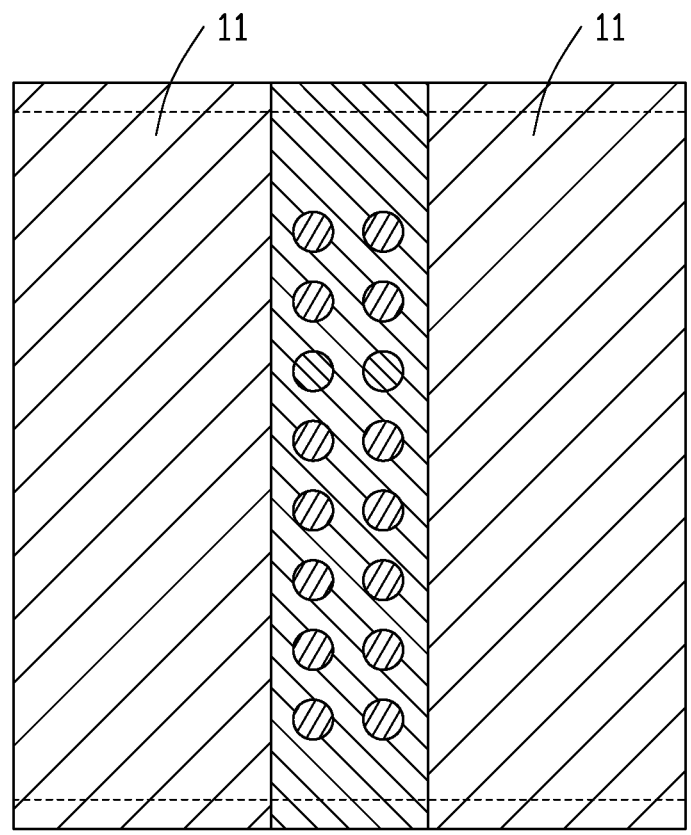
FIG. 9 is a cross-sectional view taken along line C-C of FIG. 4.

Referring to FIG. 7, when the molten plastic flows through the flow guiding channel 14, a flow velocity thereof is increased due to the gradually decreased size of the flow guiding channel 14, which assists and orients the glass fibers to parallel to one another. As shown in FIG. 8, the flash part 20 comprises a junction portion 21 abutting surface 121 of the unwanted portion 12, which means when the molten plastic flows out from the outlet 141, space for the molten plastic is enlarged significantly, such configuration allows the glass fibers to flow parallel to side walls of the receiving cavity, which leads the position generating vortices to be away from the main body 11, and the glass fibers in the metal-plastic composite part 50 obtained after removing the unwanted portion 12 are orientated as required, for example, the orientation of the glass fibers is perpendicular to the flat shaped metal part 10, therefore, referring to FIG. 9, the glass fibers are shown as a pattern consisting essentially of dots on surface of the metal-plastic composite part 50 exposed after removing the unwanted portion 12, which guarantees appearance of the metal-plastic composite part 50. The surface is formed by the molten plastic in the receiving cavity 13, and the glass fibers can be shown in other forms such as parallel lines.

Figure 10:
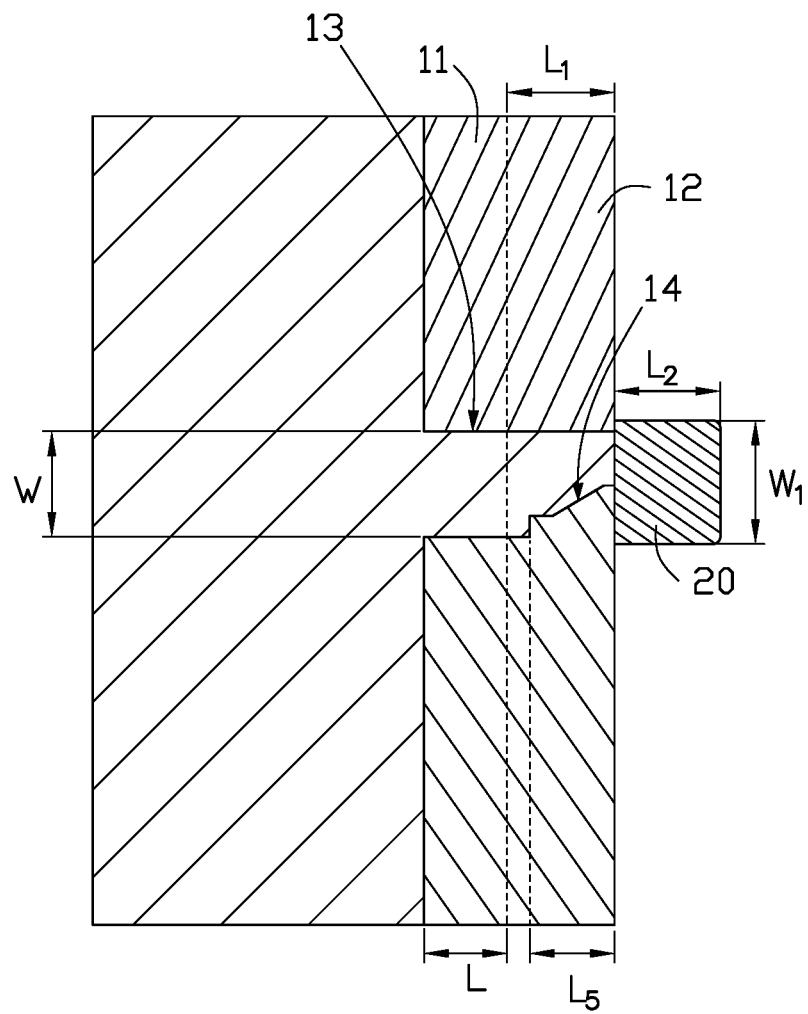
FIG. 10 is another cross-sectional view taken along line A-A of FIG. 4.

Referring to FIG. 10, in further embodiments, in a first direction, the main body 11 has a thickness L, the unwanted portion 12 has a thickness $L_1$, the flash part 20 extruding from the metal part 10 has a height $L_2$, wherein $L_1 \geq L$, $L_2 \geq L$. Preferably, the flow guiding channel 14 has a length $L_5$, wherein $L_5 \geq L$. In this embodiment, the first direction is shown as a direction of X-axis for exemplary.

According to Poiseuille's law and principle of laminar flow, larger $L_2$ and $L_5$ are preferred, which improves the distribution of the glass fibers in the plastic part 30. In practice, the relationship between L, $L_1$, $L_2$, and $L_5$ can be regulated according to Poiseuille's law, principle of laminar flow, and consideration of machining allowance and processing time.

The Poiseuille's law determines that an incompressible fluid with small Reynolds coefficient flowing in and along a pipe forms laminar flow comprising multiple layers of cylinders with increased radius from the axis of the pipe, the laminar flow rate is proportional to the pressure and inversely proportional to the length of the pipe, meaning that the laminar flow rate decreases to zero at wall of the pipe, as radius of the laminar flow increases.

The principle of laminar flow states that laminar flow tends to occur at lower flow rates through pipes, in essence, the fluid particles flow in multiple layers of cylinders, which forms laminar flow. The laminar flow at center of the pipe has a maximum flow velocity and the laminar flow near the wall of the cavity has a minimum flow velocity. The ratio of the average flow velocity of the fluid in the tube to the maximum flow velocity is 0.5.

In further embodiments, in a second direction, the receiving cavity 13 has a width of W, the flash part 20 has a width of $W_1$, wherein $W_1 \geq W$. In this embodiment, the second direction is shown as a direction of Y-axis for exemplary.

Therefore, according to continuity equation, Bernoulli's principle and Newton's law of viscosity, the tapered flow guiding channel 14 and the flash part 20 allow a runner to become narrower and then wider to guide the flow of molten plastic to rapidly pass the narrow part. The configuration of $W_1 \geq W$ slows down the flow velocity at the flash part 20, which allows the vortex to be generated in the flash part 20 and ensures that the flow guiding channel 14 is fully filled.

Figure 11:
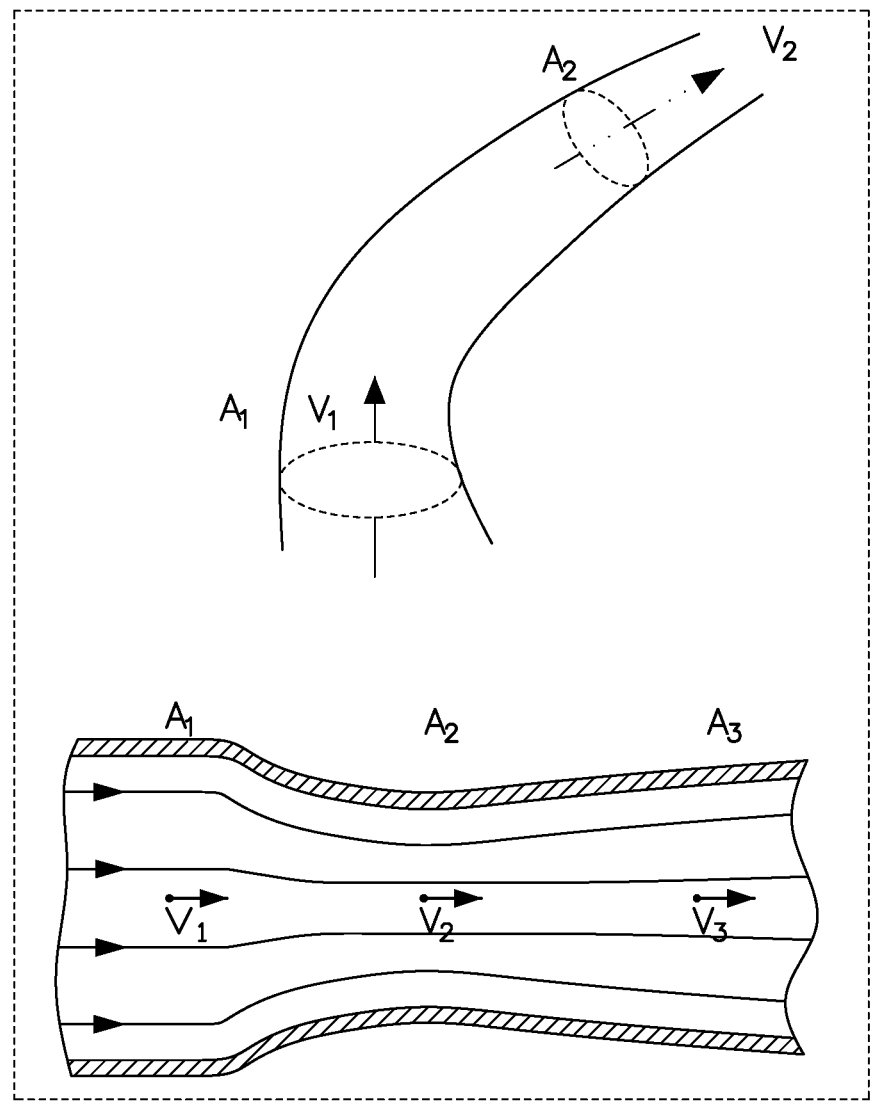
FIG. 11 shows the principle of continuity equation.

Referring to FIG. 11, according to the continuity equation, flow quantity passes two different cross sections $A_1$ and $A_2$ are equal, that is:

$$Q_1 = Q_2; \text{ or}$$

$$A_1 v_1 = A_2 v_2$$

Wherein Q is the flow quantity through the cross section A, A is any cross section of the fluid, and v is the average flow rate at corresponding A.

According to the continuity equation, assuming $A_1 > A_3 > A_2$, then $$A_1 v_1 = A_2 v_2 = A_3 v_3$$

If $A_1 > A_3 > A_2$, then $v_1 < v_3 < v_2$, then in a runner which is configured to become narrower and then wider, the fluid is accelerated through the narrow part and slowed down upon entering the wider part.

Bernoulli's principle reveals conservation of energies, such as conservation of pressure and kinetic energy, while total amount of energy in a system never changes:

$$P + \frac{1}{2}\rho v^2 + \rho g h = C; \text{ or}$$

$$P_1 + \frac{1}{2}\rho v^2 + \rho g h_1 = P_2 + \frac{1}{2}\rho v_2 + \rho g h_2;$$

wherein P is pressure of a point in the fluid, v is the velocity of the point in the fluid, h is the height of the point, ρ is the density of the fluid, g is the acceleration of gravity, and C is a constant.

Analyzing a flow rate and a pressure of melted materials with variable cross-section and fixed height, assuming $A_1 > A_2$, then $$P_1 + \frac{1}{2}\rho v^2 = P_2 + \frac{1}{2}\rho v_2$$

when $v_1 < v_2$, $P_1 > P_2$. Therefore, for melted materials with variable cross-section and fixed height, narrowing channel reduces the a pressure of the melt and promotes the flow speed.

According to Newton's law of viscosity, the shear stress between two adjacent layers of fluid is directly proportional to the negative value of the velocity gradient between the same two adjacent fluid layers:

$$F = \mu A \frac{du}{dy}, \text{ or}$$

$$\tau = \frac{F}{A} = \mu \frac{du}{dy},$$

wherein τ is the internal friction on the unit area (unit is N/m²), F is the internal friction between adjacent fluid layers (unit is N), A is the contact area between the fluid layers (unit is m²), μ is the dynamic viscosity coefficient (unit is Pa*s), du/dy is the velocity gradient and the unit is 1/s.

Figure 12:
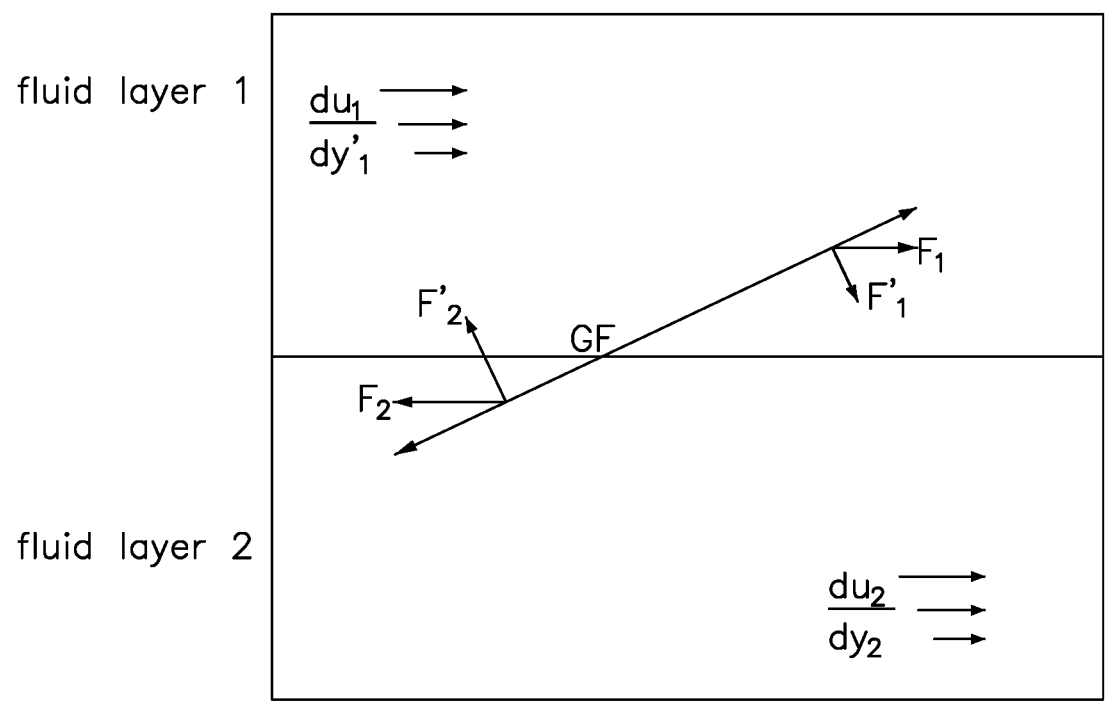
FIG. 12 shows the principle of Newtonian law of viscosity.

Referring to FIG. 12, analyzing force of glass fibers between melt flow layers with different flow rates, assuming $u_1 > u_2$, then $$\frac{du_1}{dy_1} = \frac{du_2}{dy_2},$$

$$F_1 > F_2,$$

$$F_1' > F_2'$$

therefore the glass fibers between melt flow layers tend to move in direction parallel to the flow layer.

Figure 13:
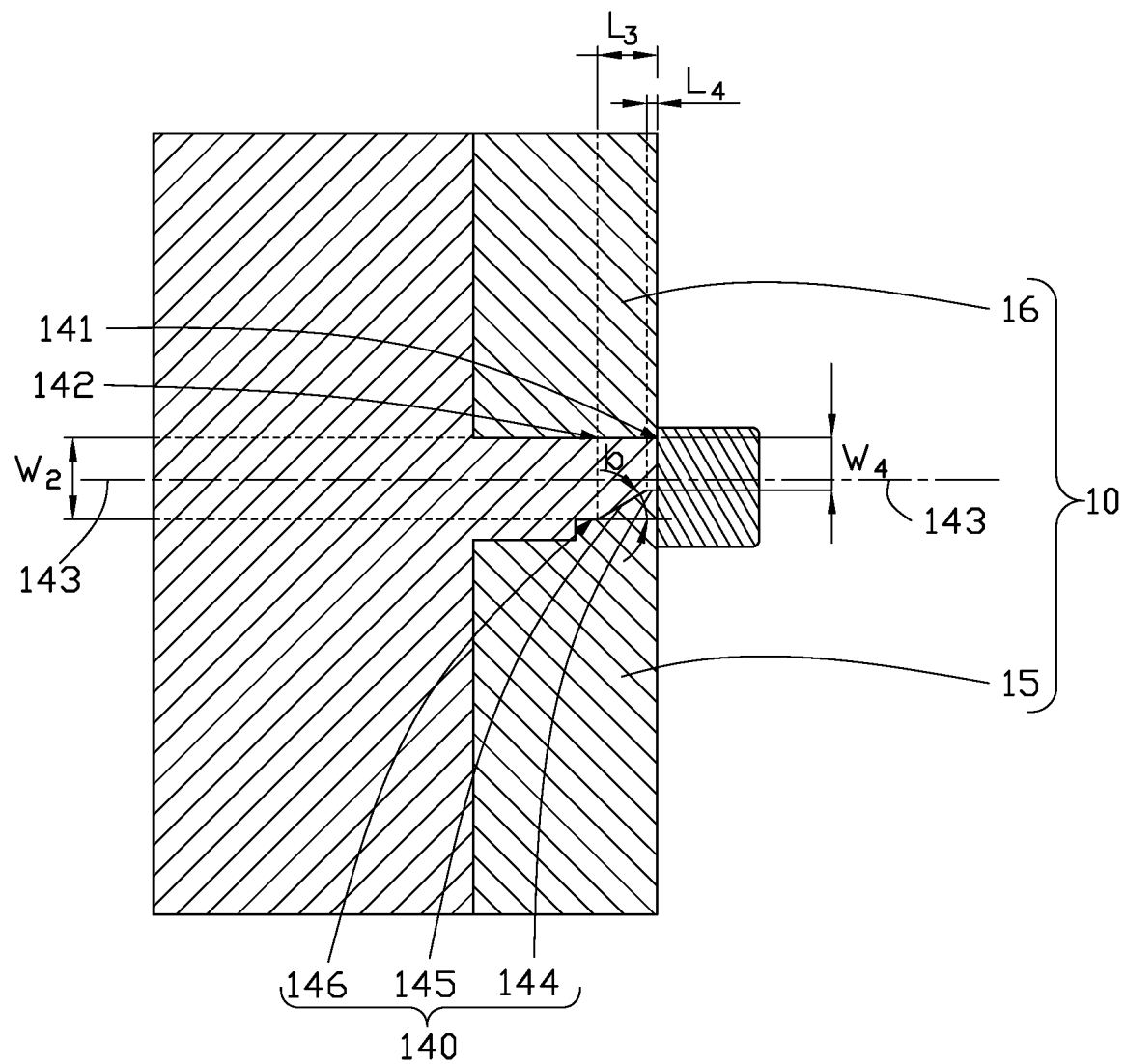
FIG. 13 is a cross-sectional view taken along line A-A of FIG. 4.

Referring to FIG. 13, in further embodiments, the outlet 141 has a width $W_4$, the inlet 142 has a width $W_2$, wherein $W_2 > W_4 \geq \frac{1}{2}W_2$. Such configuration of flow guiding channel 14 allows the molten plastic to form a boundary layer adjacent to the shell of the flow guiding channel 14, and the boundary layer is thickening as the molten plastic flows forward, until the boundary layer converges at central axis of the flow guiding channel 14.

Figure 14:
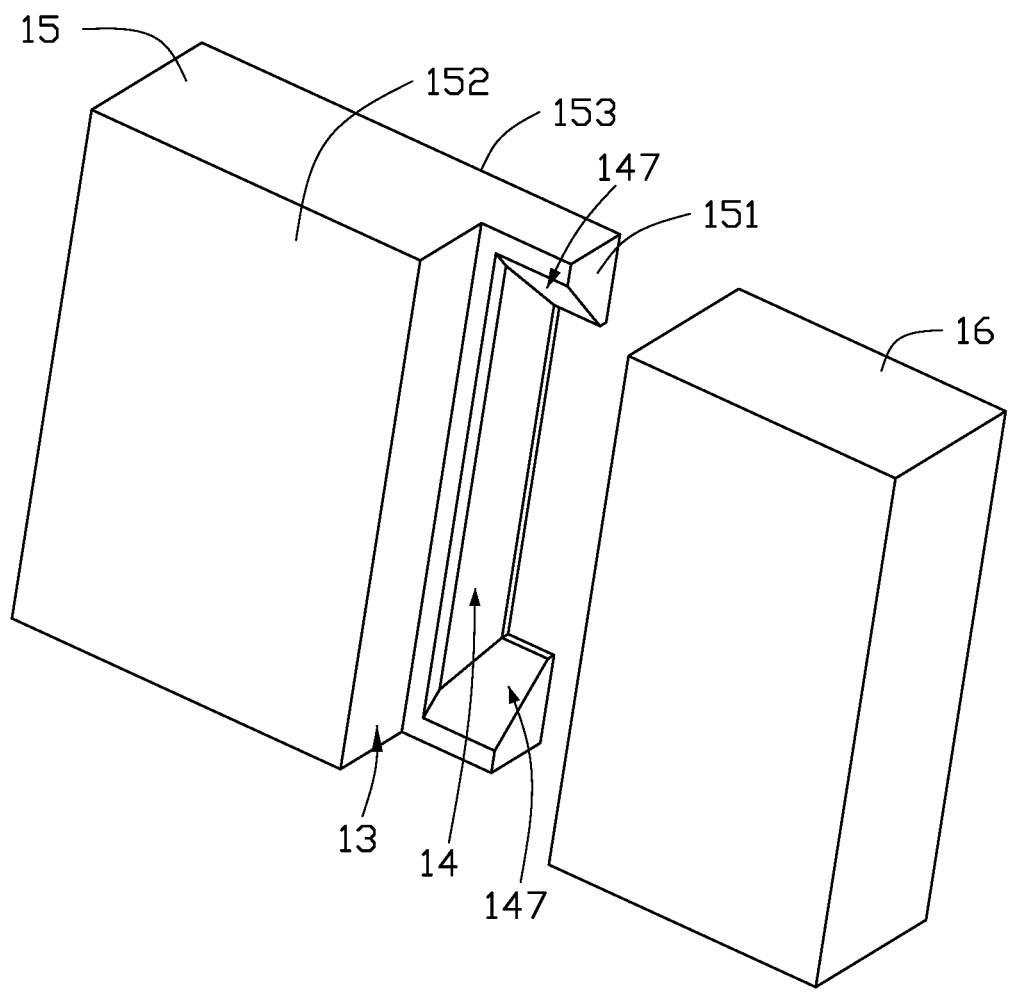
FIG. 14 is an exploded view of the metal piece of FIG. 3.

Referring to FIG. 14, in further embodiments, the metal part 10 is comprised of a first metal portion 15 and a second metal portion 16, the first metal portion 15 comprises a first side 151 adjacent to the second metal portion 16, a second side 152, and a third side 153 opposite to the second side 152, wherein the second side 152 and the third side 153 are both connected to the first side 151, the receiving cavity 13 is formed by cutting the first metal portion 15 from the first side 151 and the second side 152, the receiving cavity 13 extend through the first metal portion 15; the flowing channel 14 is formed by cutting the first metal portion 15 from the first side 151 and the third side 153. It should be noted that, the third side 153 can be regarded as equivalent to the surface 121 in FIG. 5.

Referring to FIG. 13, the flow guiding channel 14 comprises a channel wall 140 facing the second metal portion 16, the channel wall is comprised of a first wall 144, a second wall 145, and a third wall 146 connected in turn, wherein the first wall 144 and the third wall 146 are parallel to a central axis 143 of the flow guiding channel 14. A distance between the second metal portion 16 and the first wall 144 is smaller than that between the second metal portion 16 and the third wall 146. The second wall 145 is inclined relative to the central axis 143. Sum of lengths of the first wall 144 and the second wall 145 in the first direction is $L_3$, $L_3 \geq L$; the first wall 144 has a length $L_4$ in direction of the central axis 143, wherein $L_4 \leq \frac{1}{2}L_3$. In practice, the relationship between L, $L_3$, and $L_4$ can be regulated accordingly with consideration of machining allowance and processing time.

In further embodiments, a first angle b is formed between the second wall 145 and the central axis 143, the maximum tangent value and minimum tangent value of the first angle b satisfy following formula $W_4 = \frac{1}{2}W_2$, $L_4 = \frac{1}{2}L_3$, tan $b_{max} = (W_2 - \frac{1}{2}W_2)/(L_3 - \frac{1}{2}L_3) = W_2/L_3$; in cases that $W_4 = \frac{3}{4}W_2$, $L_4 = 0$, tan $b_{min} = (W_2 - \frac{3}{4}W_2)/L_3 = W_2/4L_3$.

If the first angle b exceeds the maximum value, the flow of the molten plastic will be hindered and the molten plastic may be cured at the outlet 142; if the first angle b is smaller than the minimum value, the leading and acceleration effect will be too slight for the molten plastic, which generates burrs due to sharp corners in the metal piece, such burrs reduce the strength of the plastic part 30.

The first angle b within the first angle range can lead and accelerate the molten plastic. In this embodiment, the first angle b is preferably 30°, in further embodiments, the first angle b can be any degree selected from the first angle range, such as 28° or 32°.

Figure 15:
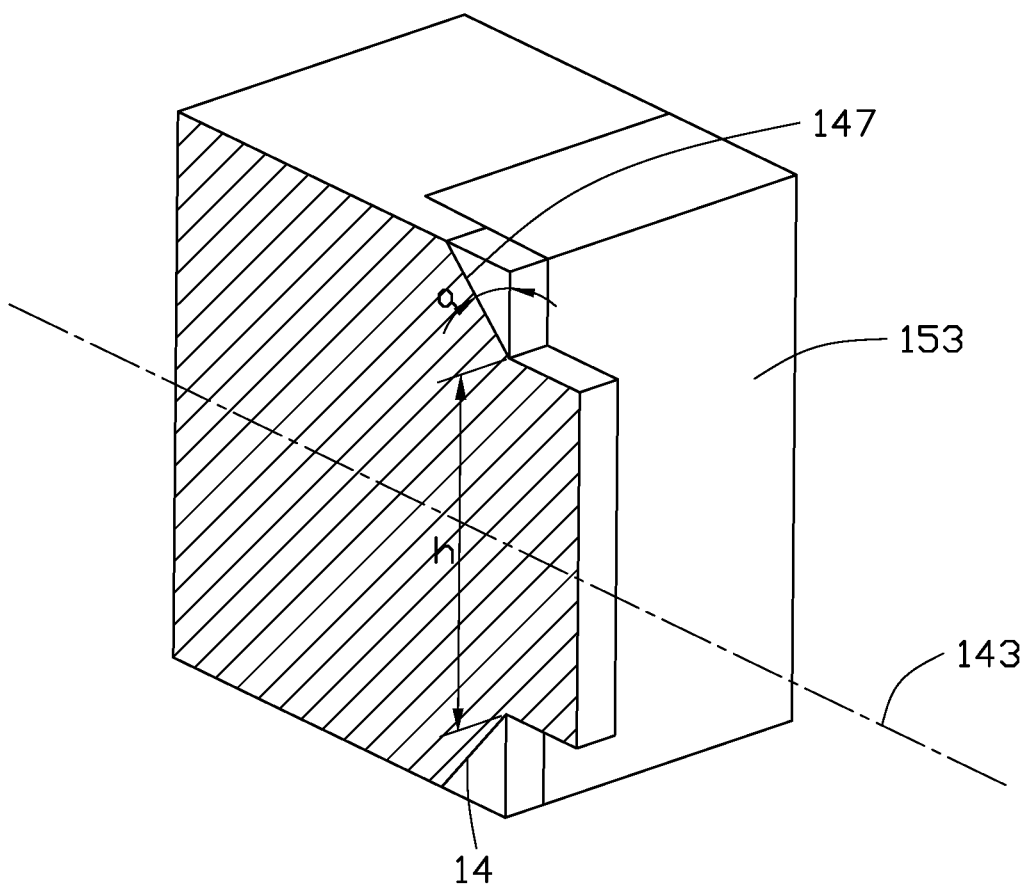

Referring to FIG. 15, the flow guiding channel 14 further comprises two fourth walls 147 arranged opposite to each other, the two fourth walls 147 are connected to the channel wall and inclined relative to the central axis 143 to form a tapered flow guiding channel 14 together with the channel wall. A second angle a is formed between the fourth wall 147 and the third side 153, the second angle a can vary in a second angle range of 30°-60°. If the second angle a is larger than 60°, the flow of the molten plastic will be hindered and the appearance of the plastic part will be affected; if the second angle a is smaller than 30°, the structural strength of the flow guiding channel 14 will be not enough at the fourth wall 147 and the flow guiding channel 14 may be deformed or cracked. In this embodiment, the second angle a is preferably 45°, in further embodiments, the second angle a can be any angle selected from the second angle range, such as 44° or 46°.

Figure 16:
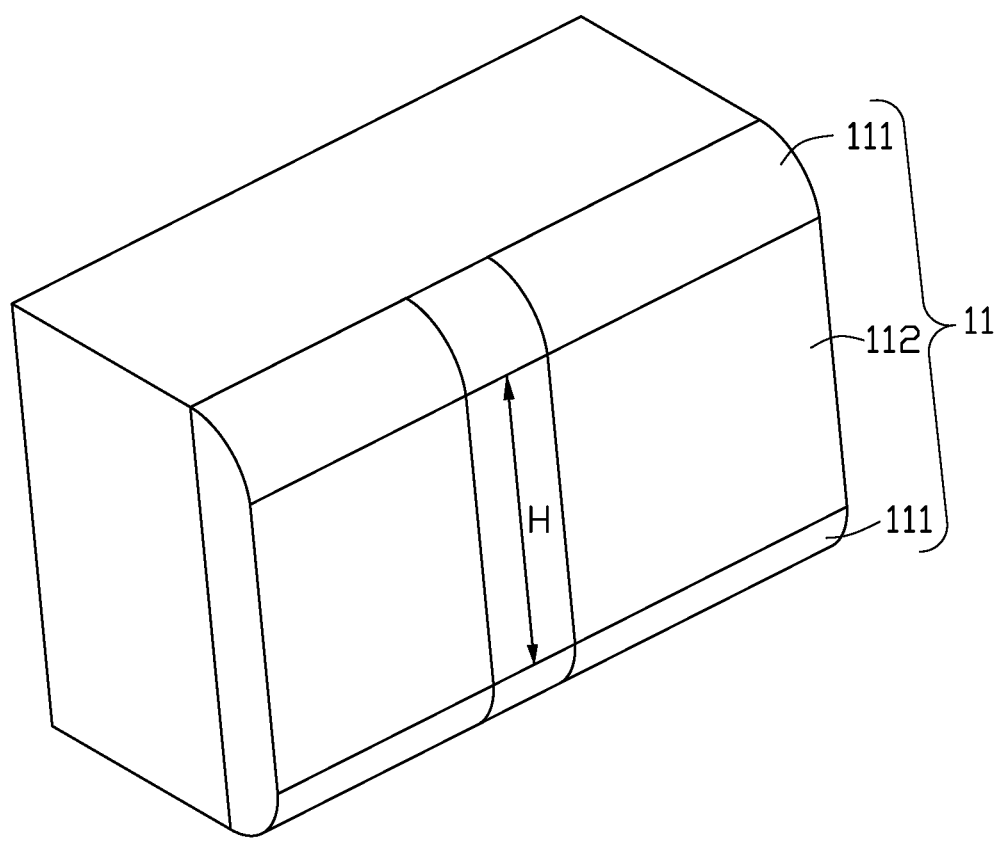
FIG. 16 is a perspective view of the metal piece obtained in step S6 according to an embodiment of the present disclosure.

Referring to FIG. 16, the method further comprises machining a top surface of the main body 11, thereby obtaining the machined top surface comprised of two arc portions 111 and a flat portion 112 arranged between the two arc portions 112. In a third direction, the flat portion 112 has a length H and the flash part 20 has a length h in direction along the extended direction of the receiving cavity 13, wherein h≥H, in this embodiment, the third direction is shown as a direction of Z-axis for exemplary. In cases that h<H, the glass fibers flow in direction parallel to the top surface, which causes defects such as glass fiber rich surfaces and vortices.

In further embodiments, a metal-plastic composite part prepared by the preparation method above mentioned is provided.

Figure 17:
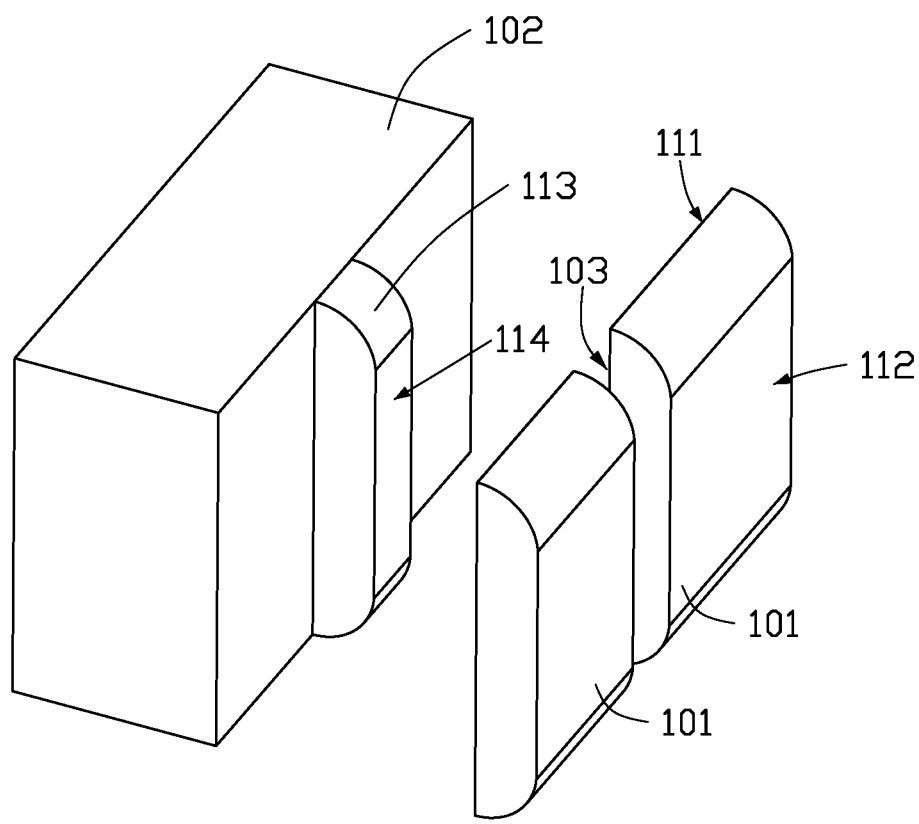
FIG. 17 is an exploded view of part of an electronic housing according to an embodiment of the present disclosure.

Referring to FIG. 17, an electronic device housing 100 is provided, FIG. 17 is an exploded view of part of an electronic housing 100, the electronic device housing 100 comprises a metal portion 101 and a plastic portion 102 contains reinforced glass fibers attached to the metal portion, the metal portion 101 includes a first surface 111, a second surface 112 opposite to the first surface, and a receiving channel 103 extends through the first surface 111 and the second surface 112, the plastic portion 102 is attached to the metal portion 101 at the first surface 111, the plastic portion comprises a filling portion 113 extending into and filling the receiving channel 103, the filling portion 113 has an exposed surface 114 flush with the second surface 112, glass fibers exposed at the exposed surface 114 are parallel to each other. The predetermined orientation comprises the glass fibers being evenly distributed in the plastic portion 102; preferably, the glass fibers have cross-sections exposed at the exposed surface 114, the cross-sections thereof forming a pattern consisting essentially of dots on the exposed surface 114.

Figure 18:
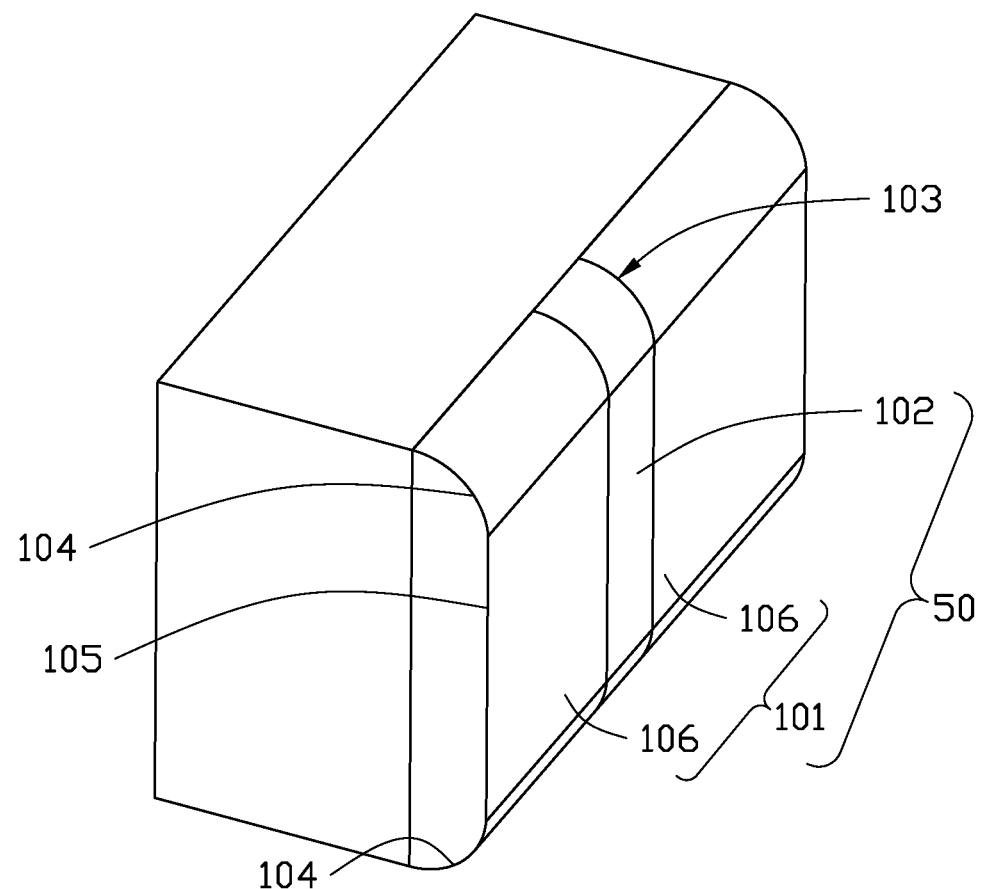
FIG. 18 is a perspective view of part of the electronic housing according to an embodiment of the present disclosure.

Referring to FIG. 18, in further embodiments, a metal-plastic composite part 50 is provided, the metal-plastic composite part 50 is comprised of the plastic portion 102 and the metal portion 101, wherein the metal-plastic composite part 50 comprises two arc parts 104 and a flat part 105 arranged between the two arc parts 104.

In further embodiments, the metal portion 101 comprises two spaced metal parts 106 separated by the receiving channel 103, at least part of the plastic portion 102 containing glass fibers is received in the receiving channel 103, the glass fibers are distributed in the plastic portion 102 in predetermined orientation. The predetermined orientation comprises the glass fibers being evenly distributed in the plastic portion 102; more preferably, the glass fibers are evenly distributed in the plastic portion 102 and have cross-sections exposed at the exposed surface 114, the cross-sections thereof forming a pattern consisting essentially of dots on the exposed surface 114.

According to further embodiments, a computer readable storage medium is provided for storing the parameter setting program, the parameter setting program is executed by the processor to perform the up mentioned parameter setting method.

In further embodiments, the glass fibers comprise a plurality of glass fiber units, each of the glass fibers has a diameter in a range from 9 μm to 13 μm.

In further embodiments, a content of the glass fibers in the plastic portion is in a range from 3 wt. % to 20 wt. %.

In further embodiments, the plastic portion comprises polybutylene terephthalate.

In further embodiments, the pattern of the glass fibers on the exposed surface consists essentially of the dots and strips, an area proportion of the dots in the exposed surface is greater than or equal to 90%.

In further embodiments, a radius of the dots on the exposed surface 114 is equal to radius of corresponding glass fibers, a length of the strips on the exposed surface 114 is larger than radius of corresponding glass fibers.

While the invention has been described in detail in connection with only a limited number of embodiments, it should be readily understood for the skilled in the art that the invention is not limited to such disclosed embodiments. Rather, the invention can be modified to incorporate any number of variations, alterations, substitutions, or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A method for making a composite piece comprised of a metal part and a glass-fiber-reinforced plastic part, the method comprising:
    providing a metal part comprising a main body and an unwanted portion adjoining the main body;
    defining a receiving cavity in the metal part, wherein the receiving cavity extending through the main body and extending halfway in the unwanted portion;
    defining a flow guiding channel through the unwanted portion, the flow guiding channel having an inlet communicating with the receiving cavity and an outlet, a size of the flow guiding channel being gradually decreased along a direction from the inlet to the outlet;
    introducing molten plastic reinforced with glass fibers into the receiving cavity from a surface of the main body facing away from the unwanted portion to fill the receiving cavity and the flow guiding channel, the molten plastic reinforced with glass fibers thereby overflowing from the outlet to form a flash section, wherein the glass fibers in the molten plastic which flow through the flow guiding channel are thereby oriented substantially parallel to each other;
    curing the molten plastic to obtain a plastic part comprising a cured plastic portion in the receiving cavity and the flow guiding channel, and a flash part cured from the flash section;
    removing the unwanted portion together with a portion of the cured plastic portion received in the flow guiding channel and a portion of the cured plastic portion received in part of the receiving cavity which is located within the unwanted portion, to obtain the composite piece comprising a glass-fiber-reinforced plastic part, wherein the glass-fiber-reinforced plastic part includes an exposed surface and glass fibers exposed at the exposed surface are substantially parallel to each other.

2. The method of claim 1, wherein a projection of the outlet on a plane where the exposed surface is located, is located within a projection of the inlet on said plane.

3. The method of claim 1, wherein in a first direction perpendicular to said plane, the main body has a thickness L, the unwanted portion has a thickness $L_1$, the flash part extruding from the metal piece has a height $L_2$, wherein $L_1 \geq L$, $L_2 \geq L$.

4. The method of claim 3, wherein in a second direction perpendicular to the first direction, the receiving cavity has a width of W, and the flash part has a width of $W_1$, wherein $W_1 \geq W$.

5. The method of claim 4, wherein in the second direction, the outlet has a width $W_4$, and the inlet has a width $W_2$, wherein $W_2 > W_4 \geq \frac{1}{2} W_2$.

6. The method of claim 5, wherein the metal part is comprised of a first metal portion and a second metal portion, the first metal portion comprises a first side adjacent to the second metal portion, a second side, and a third side opposite to the second side, the second side and the third side are both connected to the first side, the receiving cavity is defined by cutting the first metal portion from the first side and the second side, the flow guiding channel is defined by cutting the first metal portion from the first side and the third side.

7. The method of claim 6, wherein the flow guiding channel comprises a channel wall facing the second metal portion, the channel wall is comprised of a first wall, a second wall, and a third wall connected in turn, wherein the first wall and the third wall are parallel to a central axis of the flow guiding channel, a distance between the second metal portion and the first wall is smaller than that between the second metal portion and the third wall, the second wall is inclined arranged relative to the central axis, a sum of lengths of the first wall and the second wall in the first direction is $L_3$, $L_3 \geq L$; the first wall has a length $L_4$ in direction of the central axis, wherein $L_4 \leq \frac{1}{2} L_3$.

8. The method of claim 7, wherein a first angle b is formed between the second wall and the central axis, the maximum tangent value and minimum tangent value of the first angle b satisfy following formula tan $b_{max}=(W_2-\frac{1}{2}W_2)/(L_3-\frac{1}{2}L_3)=W_2/L_3$ and tan $b_{min}(W_2-\frac{3}{4}W_2)/L_3=W_2/4L_3$.

9. The method of claim 7, wherein the flow guiding channel further comprises two fourth walls arranged relative to each other, the two fourth walls are connected to the channel wall and inclined towards the central axis as extended to the outlet of the flow guiding channel, a second angle a is formed between the fourth wall and the third side, the second angle a is in a range from 30° to 60°.

10. The method of claim 1, further comprises machining a top surface of the metal-plastic composite part, thereby obtaining the machined top surface comprised of two arc portions and a flat portion arranged between the two arc portions, wherein in longitudinal direction of the receiving cavity, the flat portion has a length H and the flash part has a length h, wherein h≥H.

11. A metal-plastic composite part comprising a metal portion including a first surface and an opposite second surface, wherein the metal portion includes a receiving channel extending through the first surface and the second surface;
a plastic portion containing reinforced glass fibers attached to the first surface of the metal portion;
wherein the plastic portion comprises a filling portion extending into and filling the receiving channel, the filling portion has an exposed surface flush with the second surface, glass fibers having cross sectional faces exposed at the exposed surface of the filling portion cooperatively forming a pattern consisting essentially of dots.

12. An electronic device housing, comprising:
a metal portion including a first surface and a second surface opposite to the first surface, wherein the metal portion includes a receiving channel extending through the first surface and the second surface;
a plastic portion containing reinforced glass fibers attached to the metal portion at the first surface;
wherein the plastic portion comprises a filling portion extending into and filling the receiving channel, the filling portion has an exposed surface flush with the second surface, glass fibers exposed at the exposed surface are parallel to each other.

13. The electronic device housing of claim 12, wherein the glass fibers have cross-sections exposed at the exposed surface, the cross-sections thereof forming a pattern consisting essentially of dots on the exposed surface.

14. The electronic device housing of claim 12, wherein a metal-plastic composite part is comprised of the filling portion and the metal portion, the metal-plastic composite part comprises two arc portions and a flat portion arranged between the two arc portions.

15. The electronic device housing of claim 12, wherein the metal portion includes two spaced metal parts separated by the receiving channel.

16. The electronic device housing of claim 12, wherein each of the glass fibers has a diameter in a range from 9 μm to 13 μm.

17. The electronic device housing of claim 12, wherein a content of the glass fibers in the plastic portion is in a range from 3 wt. % to 20 wt. %.

18. The electronic device housing of claim 12, wherein the plastic portion comprises polybutylene terephthalate.

19. The electronic device housing of claim 13, wherein the pattern consists essentially of the dots and strips, an area proportion of the dots in the exposed surface is greater than or equal to 90%.

20. The electronic device housing of claim 19, wherein a radius of each of the dots on the exposed surface is equal to that of corresponding one of the glass fibers;
to a length of each of the strips on the exposed surface is larger than the radius of corresponding one of the glass fibers.

* * * * *